United States Patent
Kawasaki

[11] Patent Number: 6,059,893
[45] Date of Patent: May 9, 2000

[54] METHOD FOR CLEANING A SEMICONDUCTOR WAFER

[75] Inventor: Shinji Kawasaki, Miyazaki-pref, Japan

[73] Assignee: Oki Electric Industry Co., Ltd., Tokyo, Japan

[21] Appl. No.: 09/123,751

[22] Filed: Jul. 27, 1998

Related U.S. Application Data

[62] Division of application No. 08/597,170, Feb. 6, 1996, Pat. No. 5,806,138.

[30]    Foreign Application Priority Data

Feb. 15, 1995   [JP]   Japan .................................. 7-025742

[51] Int. Cl.$^7$ ................................. B08B 7/04; B08B 5/04
[52] U.S. Cl. ................................. 134/37; 134/21; 134/32; 134/33; 134/34; 134/902; 15/303; 15/309.2; 15/345
[58] Field of Search ................... 134/902, 21, 32, 134/34, 37, 33; 15/303, 309.2, 345, 346

[56]    References Cited

U.S. PATENT DOCUMENTS

| | | | |
|---|---|---|---|
| 3,775,806 | 12/1973 | Olbrant et al. ........................ | 15/345 X |
| 3,939,526 | 2/1976 | Mania et al. ............................ | 15/309.2 |
| 4,395,793 | 8/1983 | Wedel et al. ........................ | 15/309.2 X |
| 4,541,141 | 9/1985 | Le Goff .............................. | 15/309.2 X |
| 4,544,446 | 10/1985 | Cady ..................................... | 134/33 X |
| 4,727,614 | 3/1988 | Swistun .............................. | 15/309.2 X |
| 4,854,004 | 8/1989 | Omata et al. ......................... | 15/345 X |
| 4,871,417 | 10/1989 | Nishizawa et al. ................... | 134/33 X |
| 5,351,360 | 10/1994 | Suzuki et al. .............................. | 15/302 |
| 5,361,449 | 11/1994 | Akimoto ............................. | 15/309.2 X |
| 5,375,291 | 12/1994 | Tateyama et al. ................. | 15/309.2 X |
| 5,608,943 | 3/1997 | Konishi et al. ........................... | 15/302 |

FOREIGN PATENT DOCUMENTS 2-253620  10/1990  Japan .
2-303047  12/1990  Japan .

*Primary Examiner*—Randy Gulakowski
*Assistant Examiner*—Alexander Markoff

[57]    ABSTRACT

A semiconductor cleaning method for removing particles that have adhered to the back side of a semiconductor wafer. The semiconductor wafer is placed on a support. Inert gas is blown against the back of the semiconductor wafer by a plurality of nozzles, each of which is positioned at a predetermined angle to the back of the semiconductor wafer and inclined in a first direction. An air exhaust is located near the periphery of the semiconductor wafer and arranged so as to suck in the particles removed from the semiconductor wafer with the nozzles.

12 Claims, 5 Drawing Sheets

METHOD FOR CLEANING A SEMICONDUCTOR WAFER

This is a division of application Ser. No. 08/597,170 filed Feb. 6, 1996, now U.S. Pat. No. 5,806,138.

BACKGROUND OF THE INVENTION

1. Field of the Invention

This invention relates to a semiconductor cleaning apparatus and a method of cleaning a semiconductor device, and particularly to an apparatus for removing particles attached to the back of a semiconductor wafer and a method of efficiently eliminating the particles from the semiconductor wafer.

2. Description of the Related Art

This type of apparatus has been disclosed in Japanese Patent Application Laid-Open No. 2-253620, for example. According to the disclosure, there is provided a method of applying or blowing an inert gas and pure water or the like against the front and back of a semiconductor wafer thereby to eliminate particles on the front and back of the semiconductor wafer.

Since, however, the aforementioned method has a problem that the eliminated particles adhere to the semiconductor wafer again, it has been desired to further improve the method.

SUMMARY OF THE INVENTION

With the foregoing in view, it is therefore an object of the present invention to effectively remove particles attached to the back of a semiconductor wafer.

It is another object of the present invention to prevent particles which have been removed from the back of a semiconductor wafer from adhering to the semiconductor wafer again.

One aspect of the present invention is directed to a method of cleaning a semiconductor wafer by preparing a semiconductor wafer having a front side and a back side. The semiconductor wafer is rotated and an inert gas is blown against the back side of the semiconductor wafer to remove particles from the back side of the semiconductor wafer. The inert gas is blown against the back side of the semiconductor wafer so that a first flow is produced in a predetermined direction.

A further aspect of the present invention is directed to a method of cleaning a semiconductor device by preparing a semiconductor wafer having a front side and a back side. A first inert gas is supplied to the front side of the semiconductor wafer in a first direction, with the first inert gas being supplied thereto so that a first flow is produced in the first direction. The semiconductor wafer is rotated, and a second inert gas is blown against the back side of the semiconductor wafer to remove particles from the back side of the semiconductor wafer. The second inert gas is blown against the back side of the semiconductor wafer so that a second flow is produced in a second direction.

A further aspect of the present invention is directed to a method of cleaning a semiconductor device by preparing a semiconductor wafer having a front side and a back side. The semiconductor wafer is rotated, and an inert gas is blown against the back side of the semiconductor wafer to remove particles from the back side of the semiconductor wafer. The inert gas is blown against the back side of the semiconductor wafer so that a first flow is produced toward a periphery of the semiconductor wafer.

Yet another aspect of the present invention is directed to a method of cleaning a semiconductor device by preparing a semiconductor wafer having a front side and a back side. An inert gas is supplied to the front side of the semiconductor wafer in a predetermined direction. The inert gas is supplied thereto so that a first flow is produced in the predetermined direction. The semiconductor wafer is rotated, and the inert gas is blown against the back side of the semiconductor wafer to remove particles from the back side of the semiconductor wafer. The inert gas is blown against the back side of the semiconductor wafer so that a first flow is produced toward a periphery of the semiconductor wafer.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
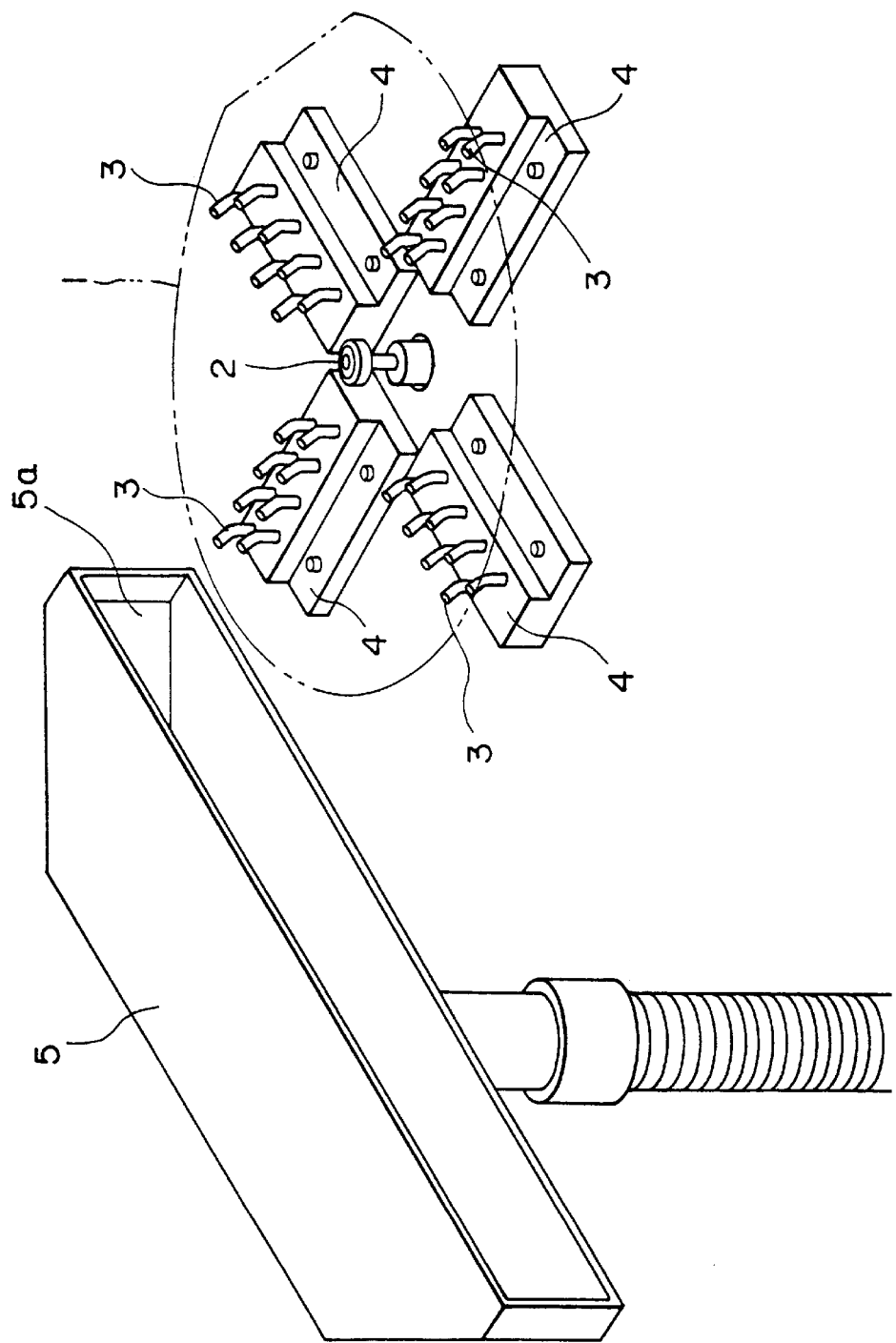
FIG. 1 is a schematic view showing a semiconductor cleaning apparatus according to a first embodiment of the present invention.
Figure 2:
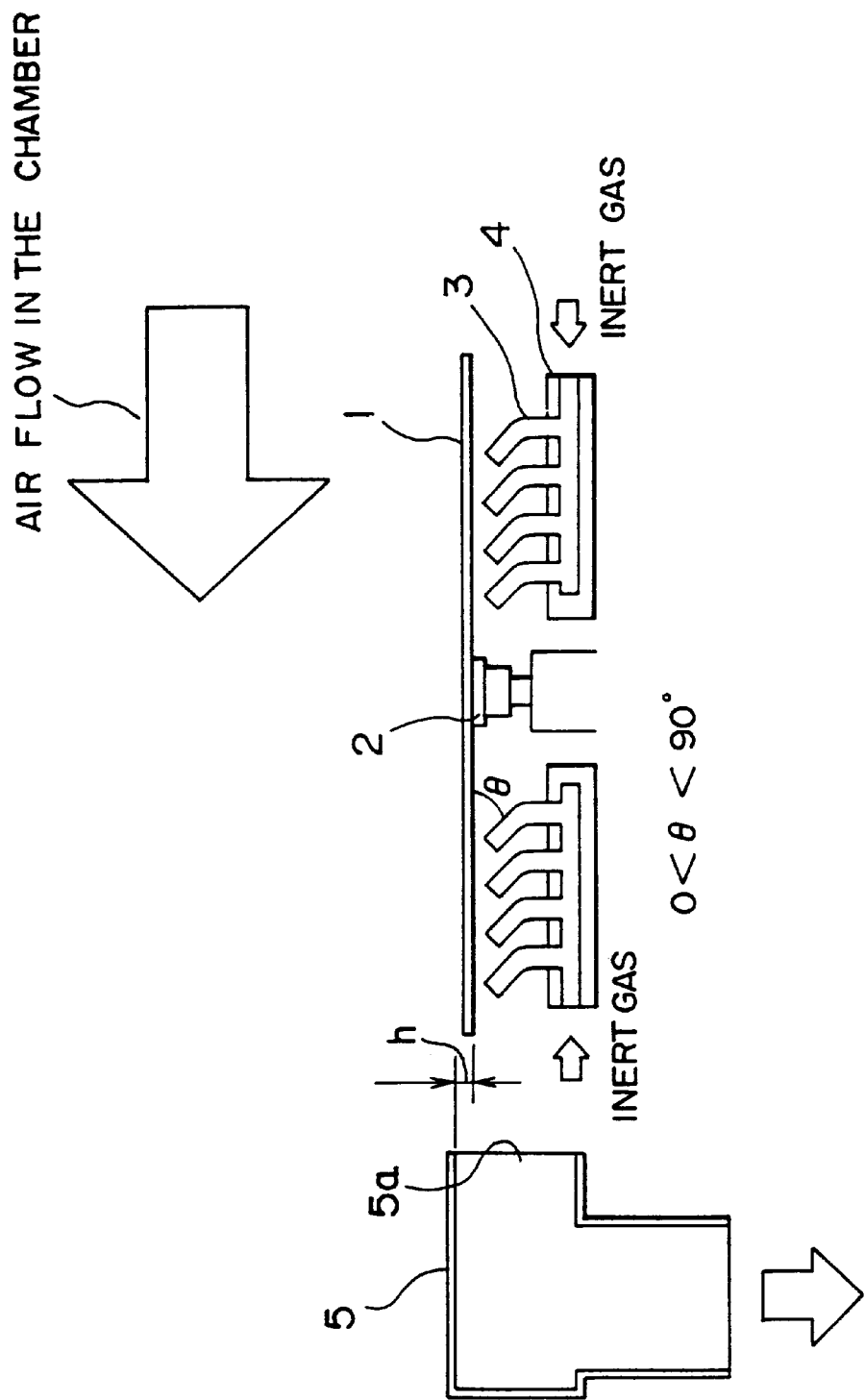
FIG. 2 is a cross-sectional view illustrating the semiconductor cleaning apparatus shown in FIG. 1.
Figure 3:
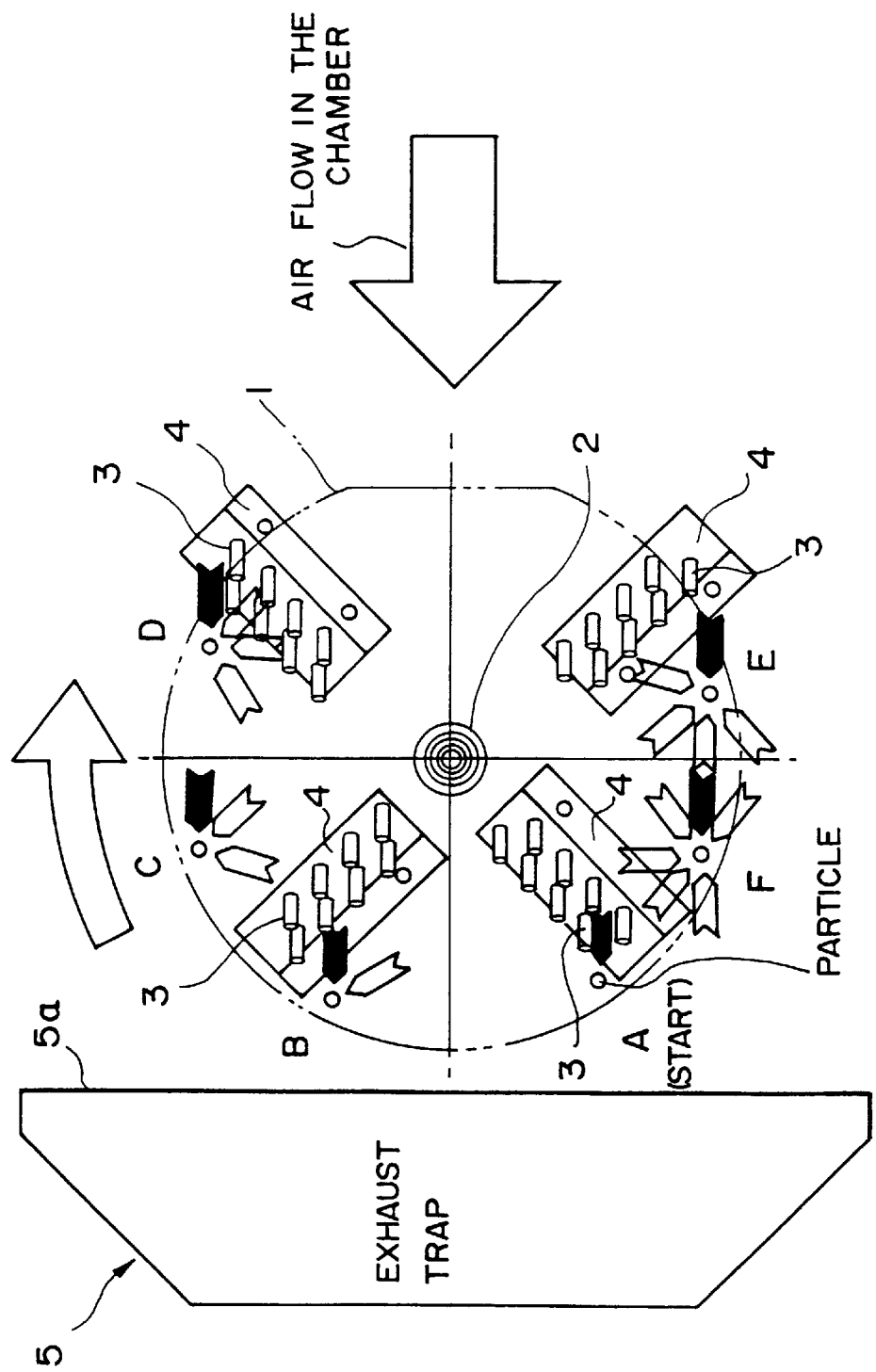
FIG. 3 is a plan view depicting the semiconductor cleaning apparatus shown in FIG. 1.

As shown in FIGS. 1–3, the first embodiment of the semiconductor cleaning apparatus includes a vacuum chuck 2, a plurality of gas discharge nozzles 3, a plurality of manifolds 4 and an exhaust trap 5. The vacuum chuck 2, the gas discharge nozzles 3, the manifolds 4 and the exhaust trap 5 are positioned within a single chamber (not shown).

The vacuum chuck 2 is used for supporting a semiconductor wafer 1 under vacuum suction. The vacuum chuck 2 is provided so as to be located substantially in the center of the semiconductor wafer 1. Further, the vacuum chuck 2 is connected to an unillustrated motor. The vacuum chuck 2 is rotated according to the rotation of the motor. Thus, if the semiconductor wafer 1 is placed on the vacuum chuck 2 under vacuum suction, the semiconductor wafer 1 is rotated together with the vacuum chuck 2.

The plurality of manifolds 4 are supplied with inert gases to be delivered or discharged to the semiconductor wafer 1. Unillustrated two-port solenoid valves are respectively provided at preceding stages of these manifolds 4 so that inert gases equal in pressure are supplied to their corresponding manifolds 4. Further, unillustrated gasline filters are provided in close proximity to the manifolds 4 respectively. The inert gases (such as nitrogen gas) supplied to the manifolds 4 are respectively discharged through the plurality of gas discharge nozzles 3.

Each of the plurality of gas discharge nozzles 3 is bent in shape. Thus, the inert gas is blown against the semiconductor wafer 1 at a predetermined angle. The predetermined angle is greater than 0° and less than 90° with respect to the semiconductor wafer 1. All the gas discharge nozzles 3 are provided so as to extend in the same direction. Thus, since the inert gas on the back side of the semiconductor wafer 1 flows in one direction, the movement of each eliminated particle is limited to one direction from right to left as seen in FIG. 1. Further, the gas discharge nozzles 3 are all held within a region in which the semiconductor wafer 1 is set, i.e., the back of the semiconductor wafer 1. Therefore, an air flow (e.g., a flow of nitrogen or the like which is inert gas) on the front side of the semiconductor wafer 1 is not affected by an air flow on the back side thereof.

Incidentally, the air flow on the front side of the semiconductor wafer 1 is set to one direction from right to left as seen in FIG. 1. The reason why the air flow on the front side of the semiconductor wafer 1 is limited to one direction, is to prevent particles from floating within the chamber.

The exhaust trap 5 has an intake port 5a wider than the outer diameter of the semiconductor wafer 1. The exhaust trap 5 performs an exhaust action at all times and is hence capable of always receiving particles eliminated from the semiconductor wafer 1. As shown in FIG. 2, the height of the exhaust trap 5 is set so as to be higher than the front of the semiconductor wafer 1. More specifically, a height difference of h is provided between a height H1 of an upper inner surface of the intake port 5a of the exhaust trap 5 and a height H2 of the reverse side of the semiconductor wafer 1. Further, the exhaust trap 5 is placed in a position as close as possible to the semiconductor wafer 1.

A method of eliminating particles, according to the present invention will now be described with reference to FIG. 3. A semiconductor wafer 1, which has been subjected to predetermined steps, is first introduced into the chamber of the present apparatus. Next, the semiconductor wafer 1 is placed on the vacuum chuck 2. At this time, the semiconductor wafer 1 is disposed so that a substantially central portion on the back side thereof is placed on the vacuum chuck 2. Next, the unillustrated motor is rotated and at the same time the manifolds 4 are supplied with the inert gases. Thus, the inert gases are discharged through the gas discharge nozzles 3 so that they are blown against the back side of the semiconductor wafer 1. As a result, the particles, which have adhered to the back of the semiconductor wafer 1, are removed from the semiconductor wafer 1 under the action of forces of the inert gases.

Let's now assume that a particle adheres to the position indicated by A on the back side of the semiconductor wafer 1. The particle is displaced in order of B, C, D, E and F positions as the semiconductor wafer 1 rotates. Since the flow of the inert gases on the back side of the semiconductor wafer 1 is now limited to one direction by the gas discharge nozzles 3, the directions of the forces of the inert gases, which are exerted on the particle at the respective positions A, B, C, D, E and F, are represented by arrows. The arrows, which are marked with the dark shades, respectively show the directions of forces of the inert gases, which are exerted on the particle at the respective positions A, B, C, D, E and F. On the other hand, the arrows of these arrows, which are represented in white, respectively show the directions in which the forces of the inert gases have been exerted on the particle at positions antecedent to the respective positions A, B, C, D, E and F. Thus, since the forces of the inert gases are applied in the direction of provision of the exhaust trap 5, the eliminated particle always floats toward the exhaust trap 5 even if the particle is placed at any position. Since the exhaust trap 5 performs an exhaust action at all times, all the suspended particles are collected into the exhaust trap 5. The above steps are continuously executed for a predetermined period of time.

After the semiconductor wafer 1 has been rotated for a fixed time, the motor is deactivated to stop the rotation of the vacuum chuck 2. Simultaneously with its stoppage, the supply of the inert gas to each manifold 4 is also stopped. Further, the vacuum suction on the semiconductor wafer 1 by the vacuum chuck 2 is stopped. Thereafter, the semiconductor wafer 1 is picked up by a robot hand or the like.

Next, another semiconductor wafer 1 is set on the vacuum chuck 2 and the cleaning step (corresponding to the step of removing the particles) referred to above is carried out. The cleaning of the back side of the semiconductor wafer 1 is finished in accordance with the series of steps referred to above.

According to the present invention, as described above, since all the gas discharge nozzles 3 extend in the same direction, the inert gases on the back side of the semiconductor wafer 1 flow in one direction. Thus, the movement of each removed particle is limited to one direction from right to left as seen in FIG. 1. Further, the gas discharge nozzles 3 are all held within the region in which the semiconductor wafer 1 is set, i.e., the back of the semiconductor wafer 1. Therefore, the air flow on the front side of the semiconductor wafer 1 is not affected by the air flow on the back side thereof. It is thus possible to prevent particles removed from the semiconductor wafer 1 and particles existing within the chamber from being adhering to the semiconductor wafer 1 again.

Further, since the matching between the air flows on the front and back sides of the semiconductor wafer 1 is made, the air flow in the chamber is not disturbed. Accordingly, the particles existing in the chamber can be prevented from flying up and adhering to the semiconductor wafer 1.

The present invention is suitable for use in, particularly, an exposure device having an exposure stage, of semiconductor devices. This reason is as follows: The semiconductor wafer 1 is placed on the exposure stage in an exposure step but is not placed in parallel on the exposure stage when the particles exist on the back of the semiconductor wafer 1. There is thus a possibility that the semiconductor wafer 1 is not accurately exposed to light (i.e., a circuit pattern is not accurately transferred onto the semiconductor wafer 1). Due to the above reason, an advantageous effect can be brought about if the particle eliminating apparatus according to the present invention is laid out in close proximity to the exposure step, the back side of the semiconductor wafer 1 is first cleaned and the semiconductor wafer 1 is then placed on the exposure stage.

A second embodiment of the present invention will now be described.

Figure 4:
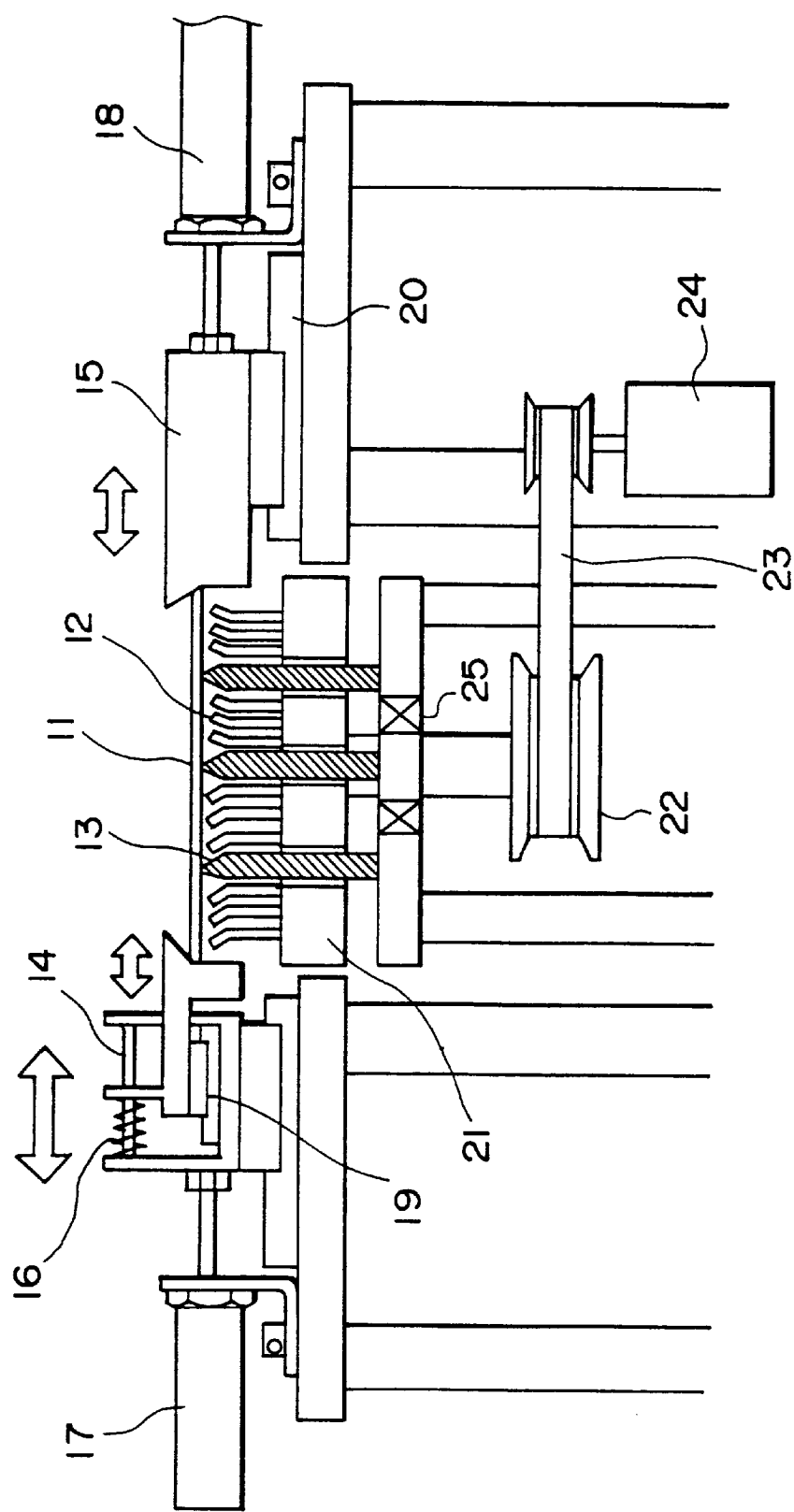
FIG. 4 is a cross-sectional view showing a semiconductor cleaning apparatus according to a second embodiment of the present invention.
Figure 5:
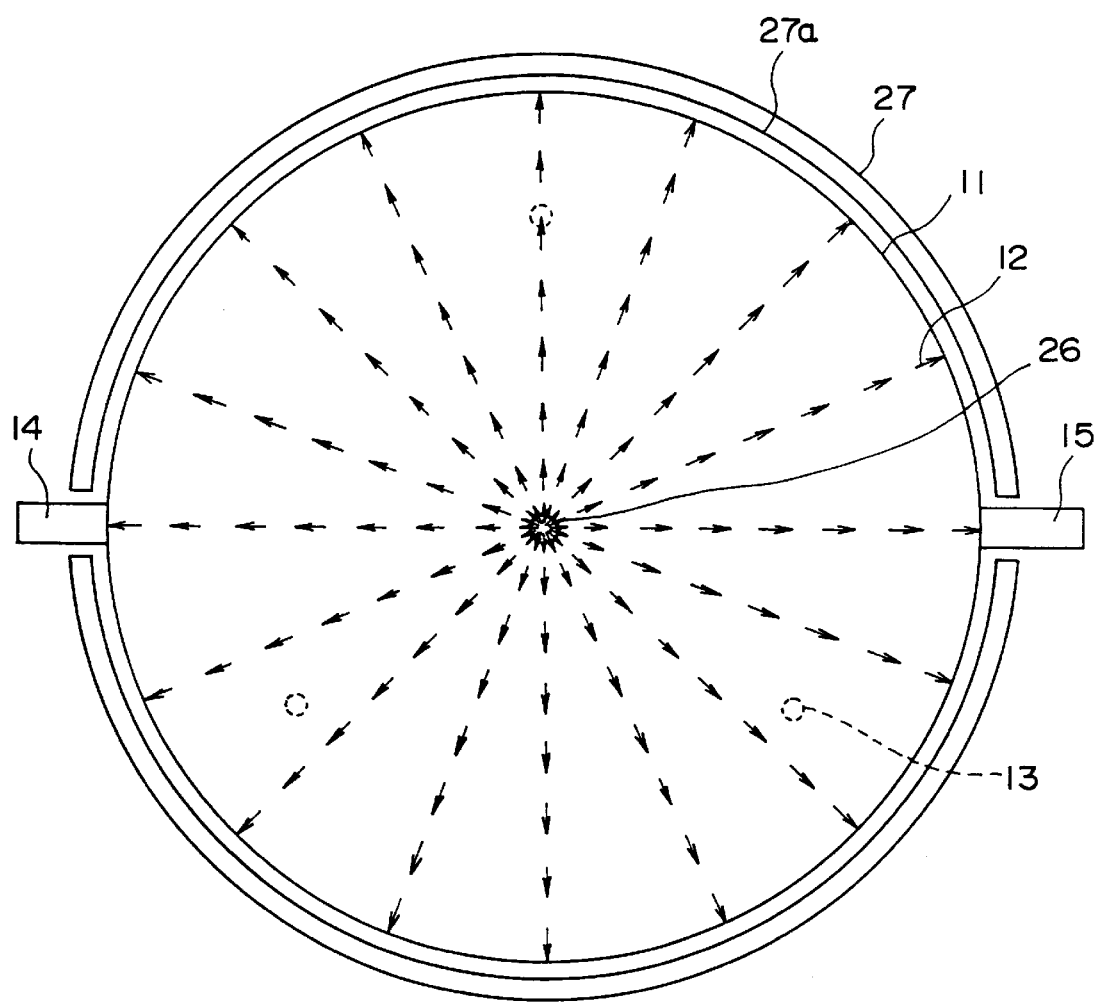
FIG. 5 is a plan view illustrating the semiconductor cleaning apparatus shown in FIG. 4.

FIG. 4 is a cross-sectional view showing an apparatus for removing particles from semiconductor wafer surfaces, which is of a semiconductor cleaning apparatus according to the second embodiment of the present invention. FIG. 5 is a plan view of the apparatus shown in FIG. 4. The particle eliminating apparatus includes wafer support pins 13 each made of quartz, a pusher clamp 14, a standard-side wafer clamp 15, a plurality of gas discharge nozzles 12, a motor 24, a timing belt 23, a gas discharge nozzles mount base 21, a timing pulley 22 and an exhaust trap 27 (see FIG. 5) having intake ports 27a. These components are identical in configuration to those employed in the first embodiment and are held within one chamber in a manner similar to the first embodiment.

Further, the particle eliminating apparatus includes an air cylinder 17 for driving the pusher clamp 14, an air cylinder 18 for driving the standard-side wafer clamp 15, a linear guide 19 used for the pusher clamp 14, a linear guide 20 used for the standard-side wafer clamp 15 and bearings 25.

The support pins 13 are used to support a semiconductor wafer 11. Further, the support pins 13 are provided so as to support the semiconductor wafer 11 at three points. The pusher clamp 14 and the standard-side wafer clamp 15 determine the position of the semiconductor wafer 11 and are used for supporting the semiconductor wafer 11.

The plurality of gas discharge nozzles 12 are shaped so as to be bent in a direction extending from the center of the semiconductor wafer 11 to the outer periphery thereof. The angle at which each gas discharge nozzle 12 is bent to the semiconductor wafer 11, falls between 0° and 90° (exclusive of 0° and 90°). The gas discharge nozzles 12 are arranged in six rows in the form of a circle. Therefore, inert gases are blown against the semiconductor wafer 11 at predetermined angles. Further, since all the gas discharge nozzles 12 extend in the radial direction of the semiconductor wafer 11, the flow of the inert gases on the back of the semiconductor wafer 11 is represented as being in a radial direction at all times. Therefore, the movement of removed particles is to always float toward the outer periphery of the semiconductor wafer 11. Incidentally, a nozzle 26 for discharging or injecting the inert gas toward the outer periphery of the semiconductor wafer 11 may be placed in the position corresponding to the central portion of the semiconductor wafer 11. The placement of the gas discharge nozzle 26 in the central position permits removal of particles that exist in the central portion of the semiconductor wafer 11. Further, the gas discharge nozzles 12 are rotated by the motor 24. At this time, a rotational force of the motor 24 is transmitted to each of the gas discharge nozzles 12 through the timing belt 23 and the timing pulley 22.

As shown in FIG. 5, the exhaust trap 27 has the two intake ports 27a provided along the outer peripheral end of the semiconductor wafer 11. Each of the intake ports 27a is shaped in the form of a predetermined curve so as to correspond to the periphery of the semiconductor wafer 11. The exhaust trap 27 performs an exhaust action at all times in a manner similar to the first embodiment. Thus, the particles removed from the semiconductor wafer 11 are collected in the exhaust trap 27.

A method of removing particles, according to the present invention, will now be described with reference to FIGS. 4 and 5. A semiconductor wafer 11, which has been subjected to predetermined steps, is first introduced into the chamber of the present apparatus. Next, the semiconductor wafer 11 is set onto the support pins 13. At this time, the pusher clamp 14 and the standard-side wafer clamp 15 are not in contact with the semiconductor wafer 11. Next, the standard-side wafer clamp 15 is displaced from right to left as seen in the drawing so as to be brought into contact with the semiconductor wafer 11. Thereafter, the pusher clamp 14 is shifted from left to right as seen in the drawing. Further, the pusher clamp 14 is urged by a spring 16. Thus, the semiconductor wafer 11 is fixed by the standard-side wafer clamp 15 and the pusher clamp 14. After the semiconductor wafer 11 has been fixed in the above-described manner, the gas discharge nozzles mount base 21 having the gas discharge nozzles 12 embedded therein is rotated under the action of the motor 24. Simultaneously with its rotation, the gas discharge nozzles 12 are supplied with the inert gases respectively. In doing so, the inert gases are discharged through the gas discharge nozzles 12 so that they are blown against the back of the semiconductor wafer 11. Thus, the particles, which have adhered to the back of the semiconductor wafer 11, can be removed from the semiconductor wafer 11 under the forces of the inert gases.

Now consider that each of particles adheres to a predetermined position on the back side of the semiconductor wafer 11 as shown in FIG. 5. The particle is displaced as the gas discharge nozzles mount base 21 rotates. Since the flow of the inert gases on the back side of the semiconductor wafer 11 is now limited to one direction (corresponding to the direction extending from the center of the semiconductor wafer 11 to the periphery thereof) by the gas discharge nozzles 12, the directions of forces of the inert gases, which are exerted on each particle, are represented as indicated by arrows at all times. Thus, since the forces of the inert gases are applied toward the periphery of the semiconductor wafer 11, i.e., the exhaust trap 27, each removed particle always floats toward the exhaust trap 27 even if the particle is placed in any position. Since the exhaust trap 27 performs the exhaust action at all times, all the suspended particles are collected into the exhaust trap 27.

Further, since the semiconductor wafer 11 is not rotated and the gas discharge nozzles mount base 21 is rotated, the particles can be removed without disturbing the air flow on the front or surface side of the semiconductor wafer 11.

The above steps are continuously executed for a predetermined period of time.

After the gas discharge nozzles mount base 21 has been rotated for a fixed time, the motor is deactivated to stop the rotation of the gas discharge nozzles mount base 21. Simultaneously with its stoppage, the supply of the inert gases to the gas discharge nozzles 12 is also stopped.

Thereafter, the pusher clamp 14 is displaced from right to left as seen in the drawing and the standard-side wafer clamp 15 is moved from left to right as seen in the drawing. Afterwards, the semiconductor wafer 11 is picked up by a robot hand or the like.

Next, another semiconductor wafer 11 is set and the cleaning step (corresponding to the step of removing the particles) referred to above is carried out. The cleaning of the back side of the semiconductor wafer 11 is finished in accordance with the series of steps referred to above.

According to the present invention, as described above, since all the gas discharge nozzles 12 are limited to a fixed direction (corresponding to the direction from the center of the semiconductor wafer 11 to the periphery thereof), the flow of the inert gases on the back side of the semiconductor wafer 11 is not disturbed. Thus, the movements of the removed particles are limited to the directions indicated by arrows in FIG. 5. Further, the gas discharge nozzles 12 are all held within the region in which the semiconductor wafer 11 is set, i.e., the back of the semiconductor wafer 11. Therefore, the air flow on the front side of the semiconductor wafer 11 is not affected by the air flow on the back side thereof. It is thus possible to prevent particles removed from the semiconductor wafer 11 and particles existing within the chamber from adhering to the semiconductor wafer 11 again.

Further, the particles are eliminated by rotating the gas discharge nozzles 12 without rotating the semiconductor wafer 11. Thus, since the air flow on the front side of the semiconductor wafer 11 is not disturbed, the air flow in the chamber remains undisturbed. Accordingly, the particles in the chamber can be prevented from flying up and adhering to the semiconductor wafer 11.

The second embodiment of the present invention is suitable for use in, particularly, an exposure device having an exposure stage in a manner similar to the first embodiment.

The aforementioned embodiments of the present invention respectively have described the method of and apparatus for cleaning the back of the semiconductor wafer. However, they may be applied to a method of and an apparatus for cleaning the front of the semiconductor wafer in place of the back thereof.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of cleaning a semiconductor wafer with an inert gas blown through a plurality of nozzles, comprising:

preparing a semiconductor wafer having a front side and a back side;

rotating the semiconductor wafer;

blowing the inert gas through the plurality of nozzles against the back side of the semiconductor wafer to remove particles from the back side of the semiconductor wafer, said inert gas being blown from the plurality of nozzles against the back side of the semiconductor wafer at a predetermined angle thereto and in only a single predetermined direction so that a first flow is produced across said wafer in said single predetermined direction; and sucking the removed particles into an intake port of an exhausting means located adjacent to the semiconductor wafer, wherein a width of the intake port is wider than an outer diameter of the semiconductor wafer.

2. A method according to claim 1, wherein the predetermined angle is greater than 0° and less than 90°.

3. A method of cleaning a semiconductor device comprising:

preparing a semiconductor wafer having a front side and a back side;

supplying a first inert gas to the front side of the semiconductor wafer in a first direction, said first inert gas being supplied thereto so that a first flow is produced in the first direction;

rotating the semiconductor wafer;

blowing a second inert gas through a plurality of nozzles against the back side of the semiconductor wafer to remove particles from the back side of the semiconductor wafer, said second inert gas being blown from the plurality of nozzles against the back side of the semiconductor wafer at a predetermined angle thereto and in only a single second direction so that a second flow is produced across said wafer in said single second direction; and sucking the particles removed by the second inert gas, into an intake port of an exhausting means located adjacent to the semiconductor wafer, wherein a width of the intake port is wider than an outer diameter of the semiconductor wafer.

4. A method according to claim 3, wherein the predetermined angle is greater than 0° and less than 90°.

5. A method of cleaning a semiconductor device with an insert gas blown through a plurality of nozzles, comprising:

preparing a semiconductor wafer having a front side and a back side;

rotating the semiconductor wafer;

blowing the inert gas through the plurality of nozzles against the back side of the semiconductor wafer in order to remove particles from the back side of the semiconductor wafer, said inert gas being blown against the back side of the semiconductor wafer from the plurality of nozzles at a predetermined angle thereto and in only a single predetermined direction so that a first flow is produced across said wafer in said single predetermined direction toward a periphery of the semiconductor wafer; and sucking the particles removed by the inert gas, into an intake port of an exhausting means located adjacent to the periphery of the semiconductor wafer, wherein a width of the intake port is wide than an outer diameter of the semiconductor wafer.

6. A method according to claim 5, wherein the predetermined angle is greater than 0° and less than 90°.

7. A method of cleaning a semiconductor device comprising:

preparing a semiconductor wafer having a front side and a back side;

supplying an inert gas to the front side of the semiconductor wafer in a predetermined direction, said inert gas being supplied thereto so that a first flow is produced in the predetermined direction;

rotating the semiconductor wafer;

blowing the inert gas through a plurality of nozzles against the back side of the semiconductor wafer in order to remove particles from the back side of the semiconductor wafer, said inert gas being blown from the plurality of nozzles against the back side of the semiconductor wafer at a predetermined angle thereto and in only a single direction such that a second flow is produced across said wafer toward a periphery of the semiconductor wafer in said single direction; and sucking the particles removed by the inert gas, into an intake port of an exhausting means located adjacent to the semiconductor wafer, wherein a width of the intake port is wider than an outer diameter of the semiconductor wafer.

8. A method according to claim 7, wherein the predetermined angle is greater than 0° and less than 90°.

9. A method according to claim 1, wherein said exhausting means is located adjacent to a periphery of the semiconductor wafer and wherein said exhausting means is arranged to receive the removed particles propelled in the predetermined direction by the inert gas discharged from the plurality of nozzles.

10. A method according to claim 3, wherein said exhausting means is located adjacent to a periphery of the semiconductor wafer and wherein said exhausting means is arranged to receive the particles propelled in the second direction by the second inert gas discharged from the plurality of nozzles.

11. A method according to claim 5, wherein said exhausting means is located adjacent to the periphery of the semiconductor wafer and wherein said exhausting means is arranged to receive the particles propelled in the predetermined direction by the inert gas discharged from the plurality of nozzles.

12. A method according to claim 7, wherein said exhausting means is located adjacent to the periphery of the semiconductor wafer and wherein said exhausting means is arranged to receive the particles propelled in the predetermined direction by the inert gas discharged from the plurality of nozzles.

* * * * *